(12) United States Patent
Park

(10) Patent No.: US 7,888,679 B2
(45) Date of Patent: Feb. 15, 2011

(54) DISPLAY DEVICE WITH RAPIDLY CRYSTALLIZING LIGHT BLOCKING LAYER AND METHOD OF MANUACTURING THE SAME

(75) Inventor: Ji-Yong Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 454 days.

(21) Appl. No.: 11/924,403

(22) Filed: Oct. 25, 2007

(65) Prior Publication Data

US 2008/0100228 A1 May 1, 2008

(30) Foreign Application Priority Data

Oct. 25, 2006 (KR) .................... 10-2006-0103930

(51) Int. Cl.
*H01L 27/14* (2006.01)
*H01L 29/18* (2006.01)

(52) U.S. Cl. .................... 257/72; 257/88; 438/151; 313/506

(58) Field of Classification Search ............ 257/72, 257/59, 66, 79, 88; 313/504, 505, 506; 438/149, 438/151

See application file for complete search history.

(56) References Cited

U.S. PATENT DOCUMENTS

| | | | |
|---|---|---|---|
| 6,515,428 B1 | 2/2003 | Yeh et al. | |
| 6,522,066 B2 | 2/2003 | Sheu et al. | |
| 7,052,931 B2 | 5/2006 | Koo et al. | |
| 7,223,997 B2* | 5/2007 | Kim et al. | 257/59 |
| 7,285,835 B2* | 10/2007 | Rizzo et al. | 257/421 |
| 7,345,314 B2* | 3/2008 | Chung et al. | 257/84 |
| 7,416,977 B2* | 8/2008 | Fukuchi et al. | 438/669 |
| 7,456,431 B2* | 11/2008 | Um et al. | 257/72 |
| 7,501,655 B2* | 3/2009 | Kim et al. | 257/59 |
| 7,507,616 B2* | 3/2009 | Seo et al. | 438/158 |
| 7,572,658 B2* | 8/2009 | Kim | 438/34 |
| 2003/0155860 A1 | 8/2003 | Choi et al. | |
| 2004/0263065 A1 | 12/2004 | Yeh et al. | |
| 2006/0049407 A1* | 3/2006 | Jung et al. | 257/72 |
| 2006/0157711 A1* | 7/2006 | Kang | 257/72 |
| 2006/0292726 A1* | 12/2006 | Akimoto et al. | 438/30 |

(Continued)

FOREIGN PATENT DOCUMENTS

JP 2002-107537 4/2002

(Continued)

*Primary Examiner*—Thuy Vinh Tran
(74) *Attorney, Agent, or Firm*—Innovation Counsel LLP

(57) ABSTRACT

A display device that requires less manufacturing time is presented. The display device includes a light blocking member formed on a substrate, a semiconductor layer formed on the light blocking member, and a gate insulating layer formed on the semiconductor layer. Gate conductors, a first interlayer insulating layer, data conductors, a second interlayer insulating layer, and a pixel electrode are formed. A third interlayer insulating layer is deposited with an opening that extends to the pixel electrode. An organic light emitting member is formed in the opening, and a common electrode is formed. The light blocking member contains nickel and silicon oxide. The presence of nickel-and-silicon-oxide light blocking member below the semiconductor improves the crystallizing speed for the semiconductor layer, reducing the overall manufacturing time. Further, the light blocking member is disposed under the pixel electrodes to prevent light leakage, improving the contrast ratio and image quality.

14 Claims, 15 Drawing Sheets

U.S. PATENT DOCUMENTS

2007/0029929 A1 * 2/2007 Nakamura et al. .......... 313/506

FOREIGN PATENT DOCUMENTS

| JP | 2005-215646 | 8/2005 |
| JP | 2005-301286 | 10/2005 |
| JP | 2005-338796 | 12/2005 |
| KR | 1020020010103 | 2/2002 |
| KR | 100388911 | 6/2003 |
| KR | 1020040021294 | 3/2004 |
| KR | 100462861 | 12/2004 |
| KR | 1020050002273 | 1/2005 |
| KR | 1020050028567 | 3/2005 |
| KR | 1020060023314 | 3/2006 |

* cited by examiner

DISPLAY DEVICE WITH RAPIDLY CRYSTALLIZING LIGHT BLOCKING LAYER AND METHOD OF MANUACTURING THE SAME

CROSS-REFERENCE TO RELATED APPLICATION

This application claims priority to and the benefit of Korean Patent Application No. 10-2006-0103930 filed in the Korean Intellectual Property Office on Oct. 25, 2006, the entire content of which is incorporated herein by reference.

BACKGROUND OF THE INVENTION (a) Field of the Invention

The present invention relates to a display device and a method of manufacturing the same, and more particularly to a method of manufacturing an organic light emitting device.

(b) Description of the Related Art

In recent years, much effort is geared to reducing the weight and thickness of a display device to meet consumer demands for lighter and thinner televisions and personal computers. As a result of this effort, cathode ray tubes (CRTs) are now being replaced with flat panel display devices.

Flat panel display devices include, among others, a liquid crystal display (LCD) device, a field emission display (FED) device, an organic light emitting device (OLED), and a plasma display device (PDP).

In general, an active matrix flat panel display has a plurality of pixels that are arranged in a matrix configuration, and images are displayed by controlling the light strength of each pixel on the basis of given information about luminance. An organic light emitting device is a self-emitting type of display device that displays images by electrically exciting and emitting a fluorescent organic material. And organic light emitting device has a low power consumption requirement, a wide viewing angle, and a fast response speed of pixels that allows it to display moving pictures with a high resolution.

Such an organic light emitting device has openings surrounding the peripheries of pixel electrodes like a bank to improve outside light efficiency and characteristics of thin film transistors, and an insulating layer serving as a light blocking member.

However, as outside light is reflected by the pixel electrodes and metal wiring, it leaks out of the device, lowering the luminance of an organic light emitting device.

An expensive polarizer can be adopted to overcome the problems, but the addition of the polarizer causes deterioration in light transmission. Further, when an expensive polarizer is provided in an organic light emitting device, it causes increase of product cost.

SUMMARY OF THE INVENTION

The present invention has been made in an effort to provide a display device with an organic light emitting component having improved luminance and reduced manufacturing cost.

In one aspect, the invention is a display device that includes a substrate, a light blocking member formed on the substrate, a semiconductor layer formed on the light blocking member, a gate insulating layer formed on the semiconductor, gate conductors formed on the gate insulating layer; a first interlayer insulating layer formed on the gate insulating layer and the gate conductors, data conductors formed on the first interlayer insulating layer; a second interlayer insulating layer formed on the data conductors and the first interlayer insulating layer, a pixel electrode formed on the second interlayer insulating layer; a third interlayer insulating layer having an opening extending to the pixel electrode, an organic light emitting member formed in the opening; and a common electrode formed on the organic light emitting member and the third interlayer insulating layer. The light blocking member contains nickel and silicon oxide.

The proportions of nickel and silicon oxide may be varied as a function of distance from the substrate. The semiconductor may be a polysilicon.

In another aspect, the invention is a method of manufacturing a display device. The method entails forming a light blocking member on a substrate by co-sputtering nickel and silicon oxide, forming a semiconductor layer on the light blocking member, forming a gate insulating layer on the semiconductor layer and the light blocking member, forming gate conductors on the gate insulating layer, forming a first insulating layer on the gate conductors and the gate insulating layer, forming data conductors on the first insulating layer, forming a second insulating layer on the data conductors and the first insulating layer, forming a pixel electrode on the second insulating layer, forming a third insulating layer having an opening that extends to the pixel electrode, forming an organic light emitting member in the opening, and forming the organic light emitting member and the third insulating layer.

A transmissive portion may be formed under the pixel electrodes in the forming of the light blocking member. The semiconductor may include polysilicon.

In yet another aspect, the invention is a display device that includes a substrate, a light blocking member formed the substrate, a semiconductor layer formed on the light blocking member, a gate insulating layer formed on the semiconductor layer, control electrodes formed on the gate insulating layer, a first interlayer insulating layer formed on the control electrodes and the gate insulating layer, and having contact holes, input electrodes and output electrodes formed on the first interlayer insulating layer, electrically connected with the semiconductor layer through the contact holes, and separated from each other by the control electrodes, and a second interlayer insulating layer formed on the input electrodes, output electrodes, and the first interlayer insulating layer, wherein the light blocking member includes nickel and silicon oxide. The pixel electrodes are formed on the second interlayer insulating layer.

DETAILED DESCRIPTION OF THE EMBODIMENTS

Figure 1:
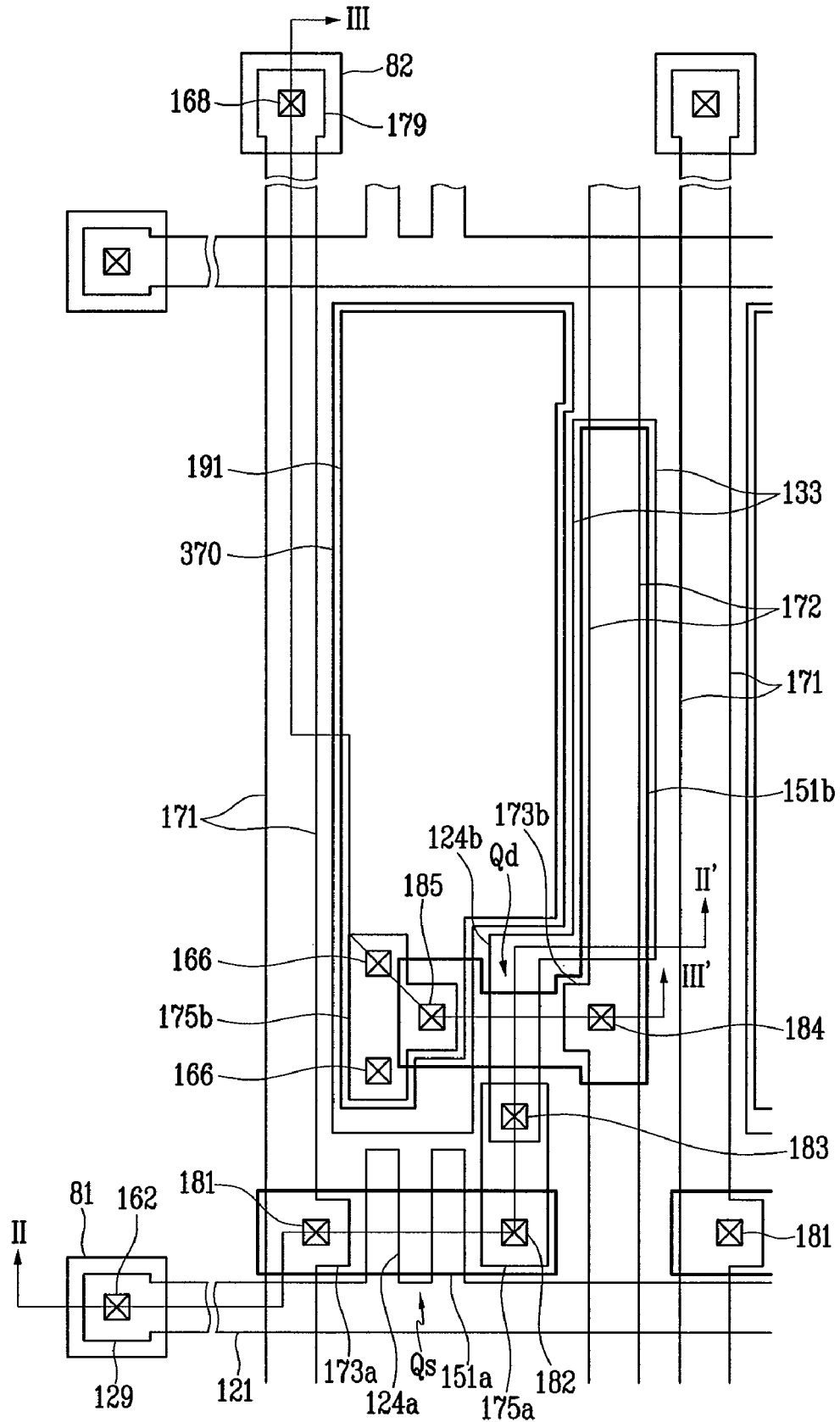
FIG. 1 is a layout of a thin film transistor array panel for an organic light emitting device according to an exemplary embodiment of the present invention.

Hereinafter, an exemplary embodiment of the present invention is described in detail with reference to accompanying drawings such that those skilled in the art can easily make and use the invention. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "connected to/with" another element, it can be directly on the other element or intervening elements may also be present. In contrast, when an element is referred to as being "directly connected to/with" another element, there are no intervening elements present.

Figure 2:
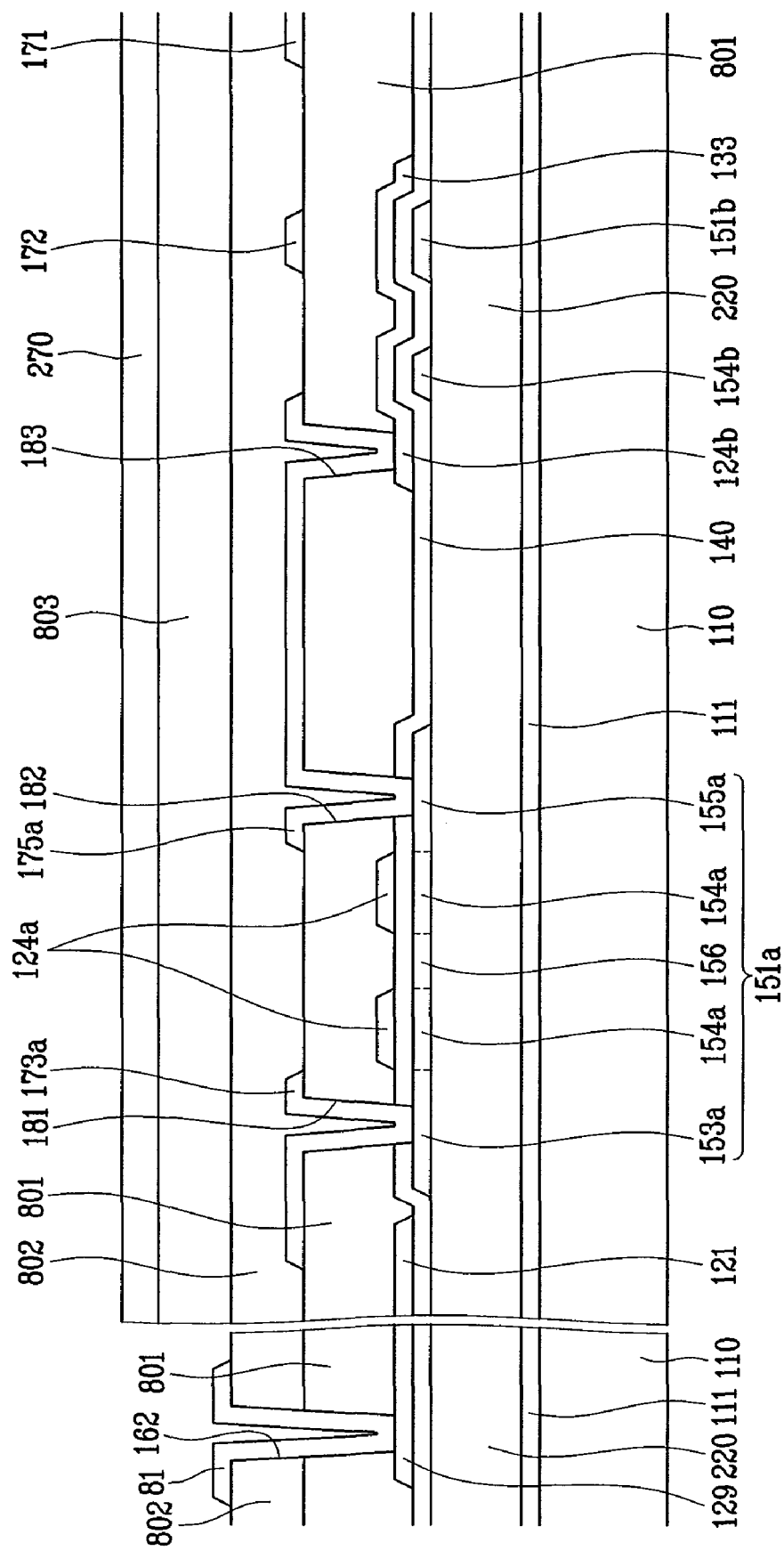
FIG. 2 and FIG. 3 are cross-sectional views of the thin film transistor array panel of FIG. 1 taken along lines II-II' and III-III', respectively.
Figure 3:
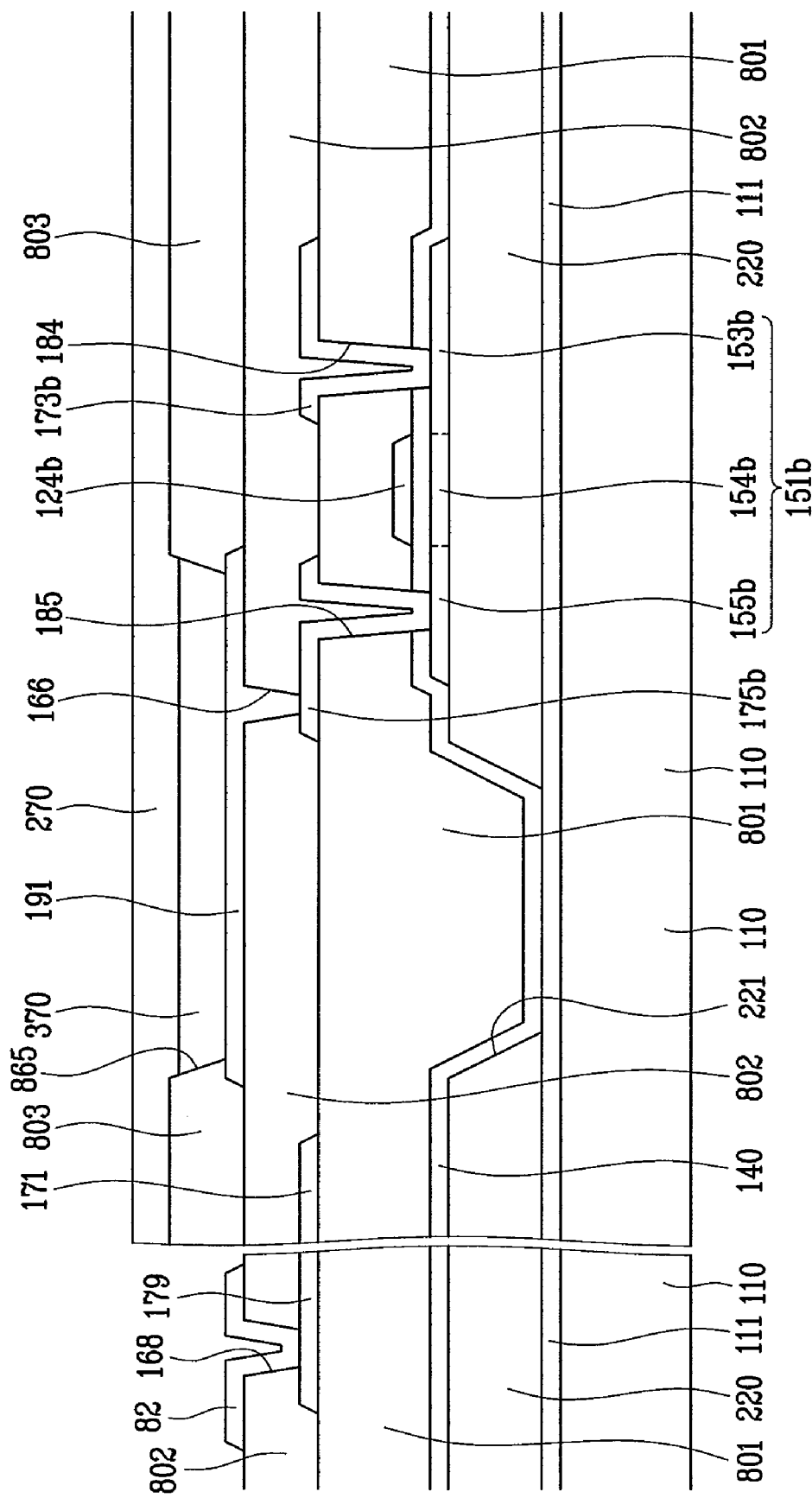

First, an organic light emitting device according to an exemplary embodiment of the present invention is described in detail referring to FIG. 1 to FIG. 3.

FIG. 1 is a layout of a thin film transistor array panel for an organic light emitting device according to an embodiment of the invention, and FIG. 2 and FIG. 3 are cross-sectional views of the thin film transistor array panel of FIG. 1, taken along lines II-II' and III-III', respectively.

A blocking film 111 made of silicon nitride (SiNx) or silicon oxide (SiOx) is formed on an insulation substrate 110 made of transparent glass or plastic, etc. The blocking film 111 may have a multilayered structure.

A light blocking member 220 made of nickel (Ni) and silicon oxide (SiOx) is formed on the blocking film 111. When nickel is used for the light blocking member 220, the closer the nickel is to the substrate 110, the higher the concentration. When silicon oxide is used for the light blocking member 220, the closer the silicon oxide is to the substrate 110, the less the concentration. The light blocking member 220 blocks outside light. The light blocking member 220 has transmissive portions 221 through which light for displaying images passes.

A plurality of first semiconductor islands 151a and second semiconductor islands 151b made of polysilicon (poly-Si) are formed on the light blocking member 220.

An intrinsic region of the first semiconductor island 151a includes first channel regions 154a, and the high concentration extrinsic region includes a first source region 153a, an intermediate region 156, and a first drain region 155a that are separated from each other by the first channel region 154a. An intrinsic region of the second semiconductor island 151b includes a second channel region 154b, and a high concentration extrinsic region includes a second source region 153b and a second drain region 155b that are separated by the second channel region 154b.

A lightly doped extrinsic region (not shown) may be formed between the first source region 153a and the first channel region 154a, the first channel region 154a and the intermediate region 156, the first channel region 154a and the first drain region 155a, the second source region 153b and the second channel region 154, and the second drain region 155b and the second channel region 154b. A lightly doped extrinsic region (not shown) prevents leakage current or punch-through from occurring in the thin film transistor, and may be replaced by an offset region without impurities.

A gate insulating layer 140 is formed on the semiconductors 151a and 151b and the light blocking member 220. The gate insulating layer 140 is made of silicon nitride (SiNx) or silicon oxide (SiOx).

A plurality of gate lines 121 including first control electrodes 124a and gate conductors including a plurality of second control electrodes 124b are formed on the gate insulating layer 140.

The gate lines 121 transmit gate signals and mainly extend horizontally. Each of the gate lines 121 includes a wide end 129 to connect with another layer or exterior driving circuit, and the first control electrodes 124a extend over the gate lines 121. When a gate driving circuit (not shown) generating gate signals is integrated into the substrate 110, the gate lines 121 may extend and directly connect with the gate driving circuit.

The second control electrodes 124b are separated from the gate lines 121 and include storage electrodes 133. Referring to the layout view of FIG. 1, a storage electrode 133 extends upward, turns to the right, and then extends upward again.

The gate conductors 121 and 124b may be made of an aluminum-based metal of aluminum (Al) or an aluminum alloy, a silver-based metal of silver (Ag) or a silver alloy, a copper-based metal of copper (Cu) or a copper alloy, a molybdenum-based metal of molybdenum (Mo) or a molybdenum alloy, or chromium (Cr), tantalum (Ta), titanium (Ti), tungsten (W), etc. However, the gate lines 121 and storage electrode lines 131 may have a multilayered structure including two conductive layers (not shown) having different physical properties. One of the conductive layers may be made of a metal with low resistivity, such as an aluminum-based metal, a silver-based metal, or a copper-based metal, to reduce signal delay or voltage drop in the gate lines 121 and the second control electrodes 124b. The other conductive layer may be made of other materials, particularly materials having excellent contact characteristics with indium tin oxide (ITO) and indium zinc oxide (IZO), such as a molybdenum-based metal, chromium, tantalum, titanium, etc. A chromium lower layer and an aluminum (alloy) upper layer, and an aluminum (alloy) lower layer and molybdenum (alloy) upper layer, may be referred to, by way of examples, for the composition. The gate conductors 121 and 124b, however, may be made of various other metals and conductors.

The sides of the gate conductors 121 and 124b may be inclined at an angle of inclination in the range of 30° to 80° with respect to the surface of the substrate 110.

A first interlayer insulating layer 801 is formed on the gate conductors 121 and 124b. The first interlayer insulating layer 801 may be made of silicon oxide (SiOx).

A plurality of contact holes 181, 182, 183, 184, and 185, which expose the first and second source regions 153a and 153b and the first and second drain regions 155a and 155b, are formed on the first interlayer insulating layer 801 and the gate insulating layer 140.

A plurality of data conductors including a plurality of data lines 171, a plurality of driving voltage lines 172, and a plurality of first and second output electrodes 175a and 175b are formed on the first interlayer insulating layer 801.

The data lines 171 transmit data signals and extend vertically in the layout view of FIG. 1, perpendicularly to the gate lines 121. Each of the data lines 171 has a wide end 179 to contact a plurality of first input electrodes 173a extending toward the first control electrodes 124a and other layers or exterior driving circuits.

The driving voltage lines 172 transmit driving voltages and extend vertically in the view of FIG. 1 across the gate lines 121. Each of the driving voltage lines 172 includes a plurality of second input electrodes 173b extending toward the second control electrodes 124b. The driving voltage lines 172 overlap the storage electrodes 133 and may be connected with them.

The first and second output electrodes 175a and 175b are separated from each other and from the data lines 171 and the driving voltage lines 172. The first input electrode 173a and the first output electrode 175a are across the first control electrode 124a from each other. Similarly, the second input electrode 173b and the second output electrode 175b are across the second control electrode 124b from each other.

The first and second input electrodes 173a and 173b and the first and second output electrodes 175a and 175b may be connected with other signal lines (not shown).

When the data driving circuit (not shown) generating data signals is integrated into the substrate 110, the data lines 171 may extend to be directly connected with the data driving circuit.

The data conductors 171, 172, 175a, and 175b may be made of a refractory metal such as molybdenum, chromium, tantalum, and titanium, or alloys thereof, and may have a multilayered structure formed of a conductive layer (not shown) of a refractory metal and a conductive layer of a low resistance material (not shown). A double-layered structure including a chromium or molybdenum (alloy) lower layer and an aluminum (alloy) upper layer, or a triple-layered structure including a molybdenum (alloy) lower layer, an aluminum (alloy) intermediate layer, and a molybdenum (alloy) upper layer, may be referred to, by way of examples, as a multilayered structure. However, the data conductors 171, 172, 175a, and 175b may be formed of a variety of metals or conductors.

Similar to the gate conductors 121 and 124b, the sides of the data conductors 171, 172, 175a, and 175b may also be inclined at an angle of inclination in the range of 30° to 80° with respect to the surface of the substrate 110.

A second interlayer insulating layer 802 is formed on the data conductors 171, 173a, 173b, 175a, and 175b and the first interlayer insulating layer 801. A second interlayer insulating layer 802 has a plurality of contact holes 162, 166, and 168 that respectively expose the ends 129 of the gate lines 121, the ends 179 of the data lines 171, and the second output electrodes 175b.

A plurality of contact assistants 81 and 82 and pixel electrodes 191 are formed on the second interlayer insulating layer 802. They may be made of a transparent conductive material such as ITO or IZO, or a reflective metal such as aluminum, silver, or an alloy thereof.

The pixel electrodes 191 are physically and electrically connected with the second output electrodes 175b through contact holes 166.

The contact assistants 81 and 82 are respectively connected with the wide ends 129 of the gate lines 121 and the wide ends 179 of the data lines 171 through the contact holes 162 and 168. The contact assistants 81 and 82 attach the wide ends 179 and 129 of the data lines 171 and gate lines 121 to outside components and protect the wide ends 179, 129.

A third interlayer insulating layer 803 is formed on the second interlayer insulating layer 802. The third interlayer insulating layer 803 is formed of an organic insulator or an inorganic insulator, and has an opening 865 at the pixel electrode 191. The third interlayer insulating layer 803 may be formed of a photoresist including a black pigment. The third interlayer insulating layer 803 blocks outside light together with the light blocking member 220.

An organic light emitting member 370 is formed in the opening 865 defined by the third interlayer insulating layer 803. The organic light emitting member 370 is made of an organic material that emits any one of three primary colors of red, green, and blue. The organic light emitting device displays a desired image by spatially combining the primary colors of the organic light emitting members 370.

The organic light emitting member 370 may have a multi-layered structure that includes an auxiliary layer (not shown) for improving light-emitting efficiency of the emission layer, other than the emission layer (not shown) for emitting light. The auxiliary layer may be an electron transport layer (not shown) and a hole transport layer (not shown) for balancing electrons and holes, and an electron injecting layer (not shown) and a hole injecting layer (not shown) for injection of electrons and holes.

A common electrode 270 is formed on the organic light emitting member 370 and the third interlayer insulating layer 803. A common voltage Vss is applied to the common electrode 270, which is made of a reflective metal including Ca, Ba, Mg, Al, and Ag, or a transparent conductive material such as ITO or IZO.

In the organic light emitting device, the first control electrode 124a connected with the gate line 121, and the first input electrode 173a and the first output electrode 175a connected with the data line 171, form a switching thin film transistor (switching TFT) Qs, together with the first semiconductor island 151a. A channel for the switching thin film transistor Qs is formed at the first channel region 154a between the first input electrode 173a and the first output electrode 175a. The second control electrode 124b connected with the first output electrode 175a, the second input electrode 173b connected with the driving voltage line 172, and the second output electrode 175b connected with the pixel electrode 191 form a thin film transistor (driving TFT) Qd together with the second semiconductor island 151b. A channel for the thin film transistor Qd is formed at the second channel region 154b between the second input electrode 173b and the second output electrode 175b.

A pixel electrode 191, the organic light emitting member 370, and the common electrode 270 form an organic light emitting diode LD, and the pixel electrode 191 serves as an anode and the common electrode 270 serves as a cathode (alternatively, the pixel electrode 191 serves as a cathode and the common electrode 270 serves as an anode). A storage electrode 133 and a driving voltage line 172 overlap to form a storage capacitor Cst.

The organic light emitting device displays an image by emitting light above or below the substrate 110. Opaque pixel electrodes 191 and a transparent common electrode 270 are applied to a top emission type of organic light emitting device that displays an image above the substrate 110, and the transparent pixel electrodes 191 and the opaque common electrode 270 are applied to a bottom emission type of organic light emitting device that displays an image below the substrate 110.

A method of manufacturing the organic light emitting device shown in FIG. 1 to FIG. 3 is described hereafter in detail with reference to FIG. 4 to FIG. 15.

Figure 4:
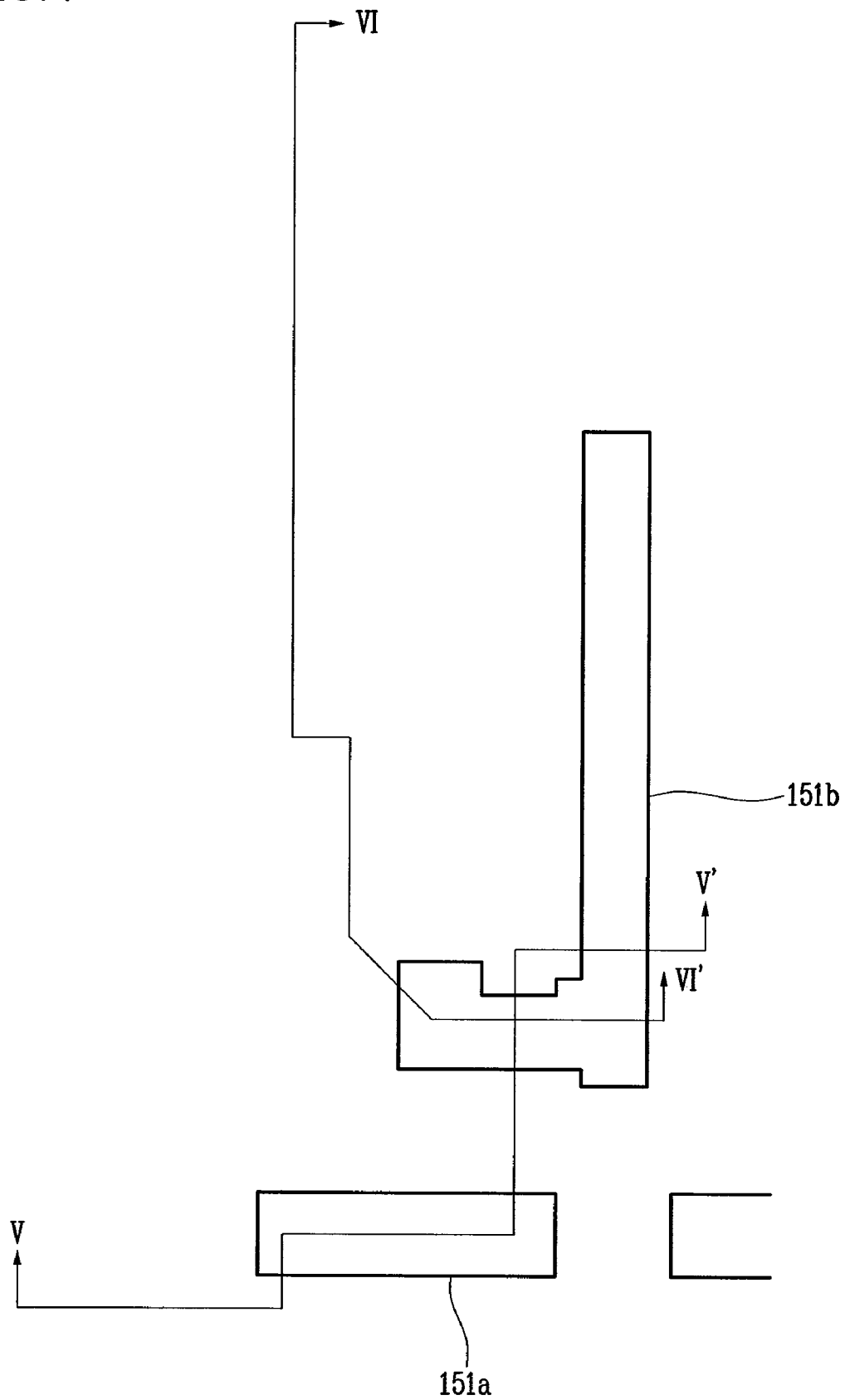
FIG. 4 is a panel layout during the manufacture of the thin film transistor array panel of FIG. 1 according to an exemplary embodiment of the present invention.
Figure 5:
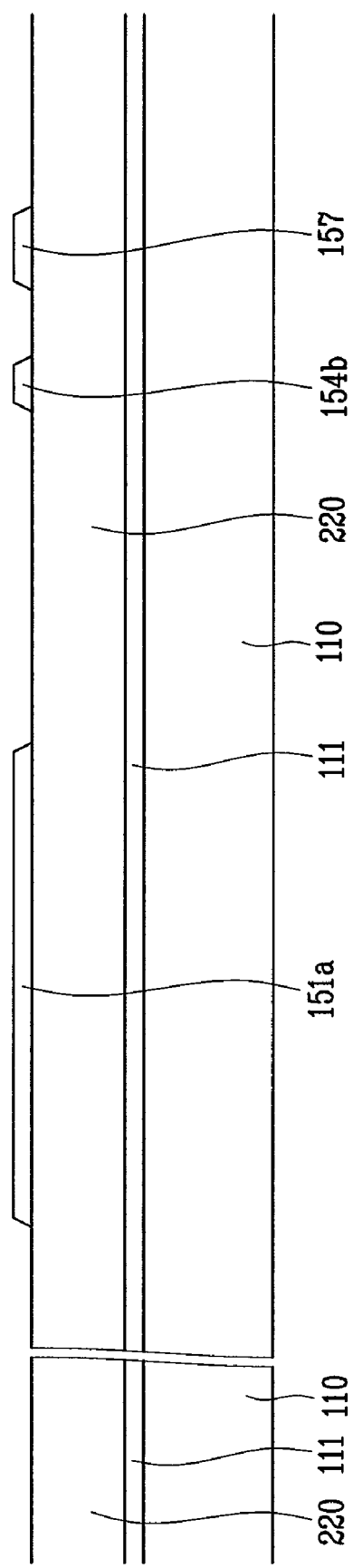
FIG. 5 and FIG. 6 are cross-sectional views of the thin film transistor array panel of FIG. 4 taken along lines V-V' and VI-VI', respectively.
Figure 6:
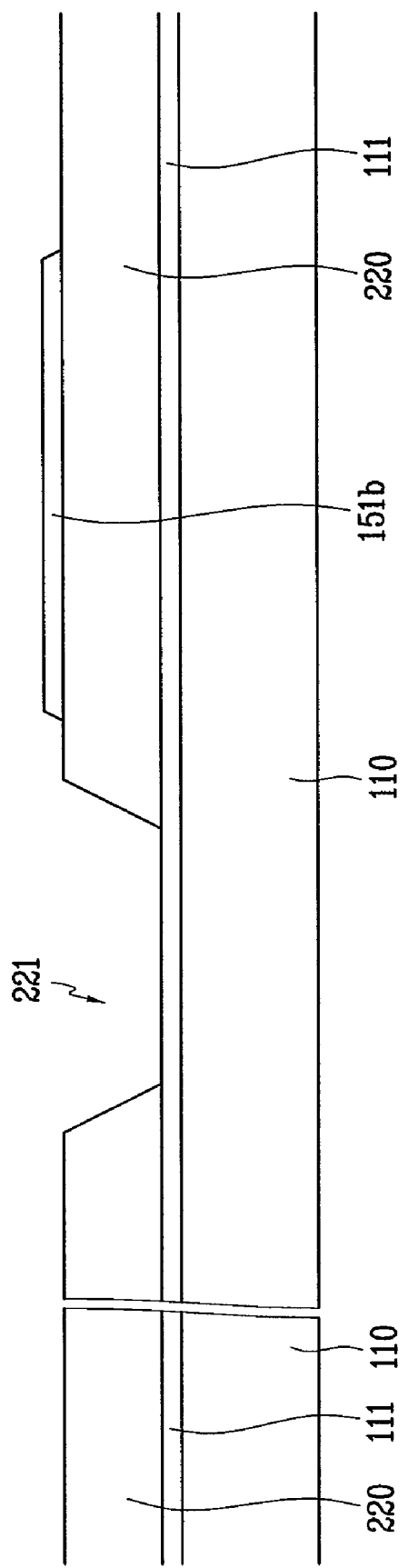
Figure 7:
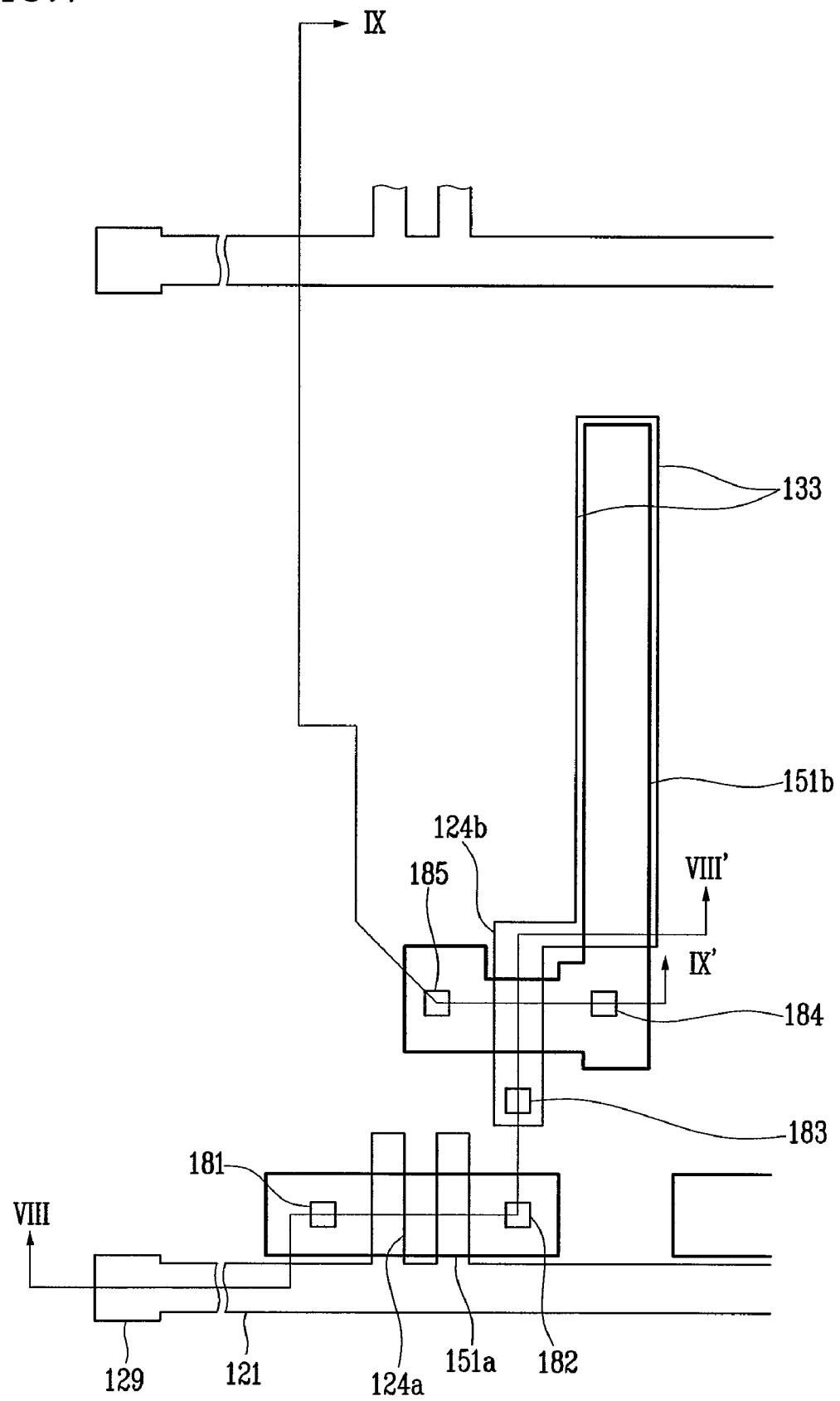
FIG. 7 is a layout of the thin film transistor array panel in a process after that of FIG. 4.
Figure 8:
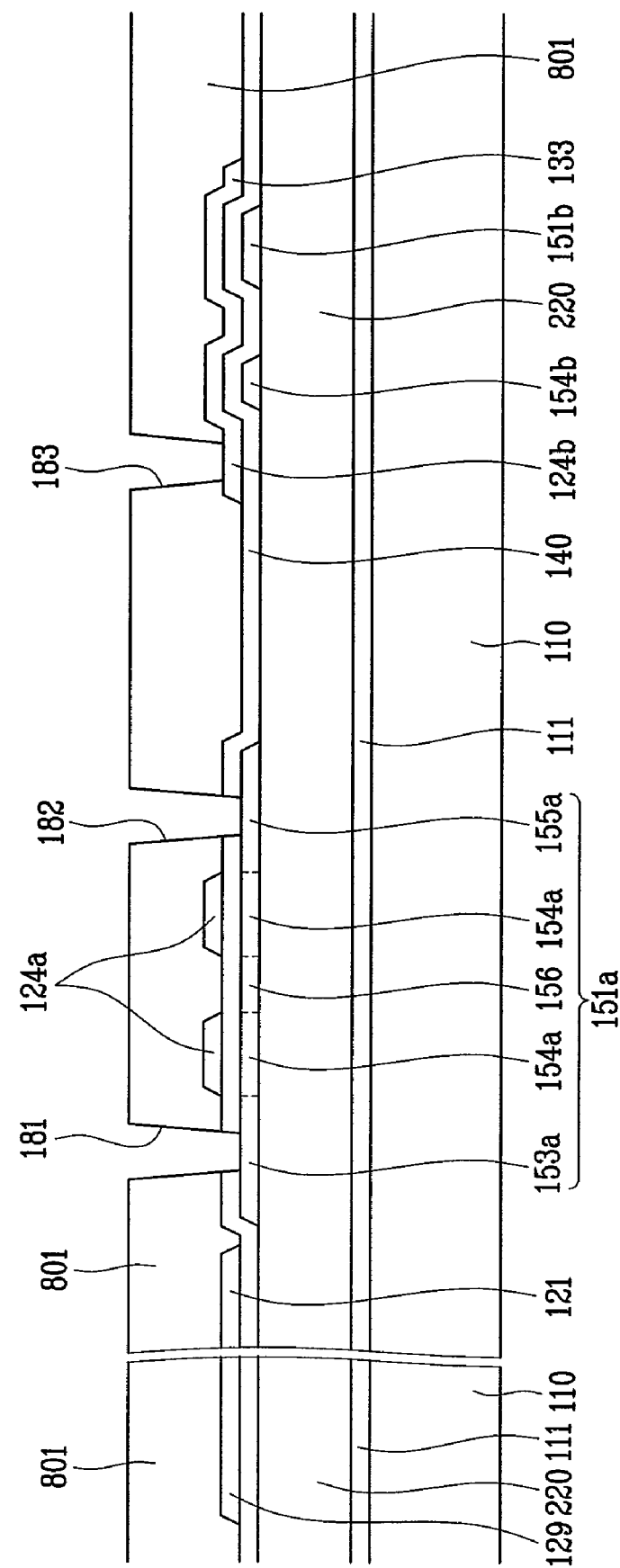
FIG. 8 and FIG. 9 are cross-sectional views of the thin film transistor array panel of FIG. 7 taken along lines VIII-VIII' and IX-IX', respectively.
Figure 9:
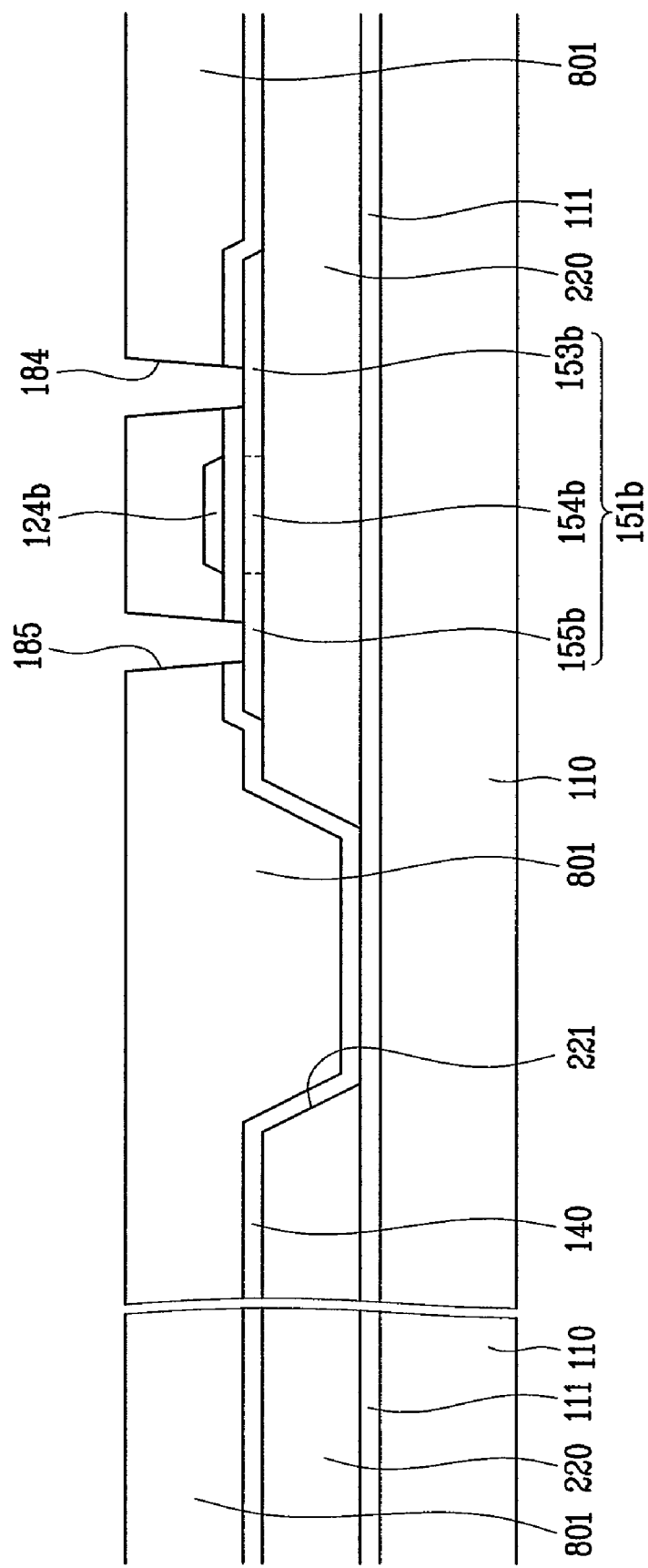
Figure 10:
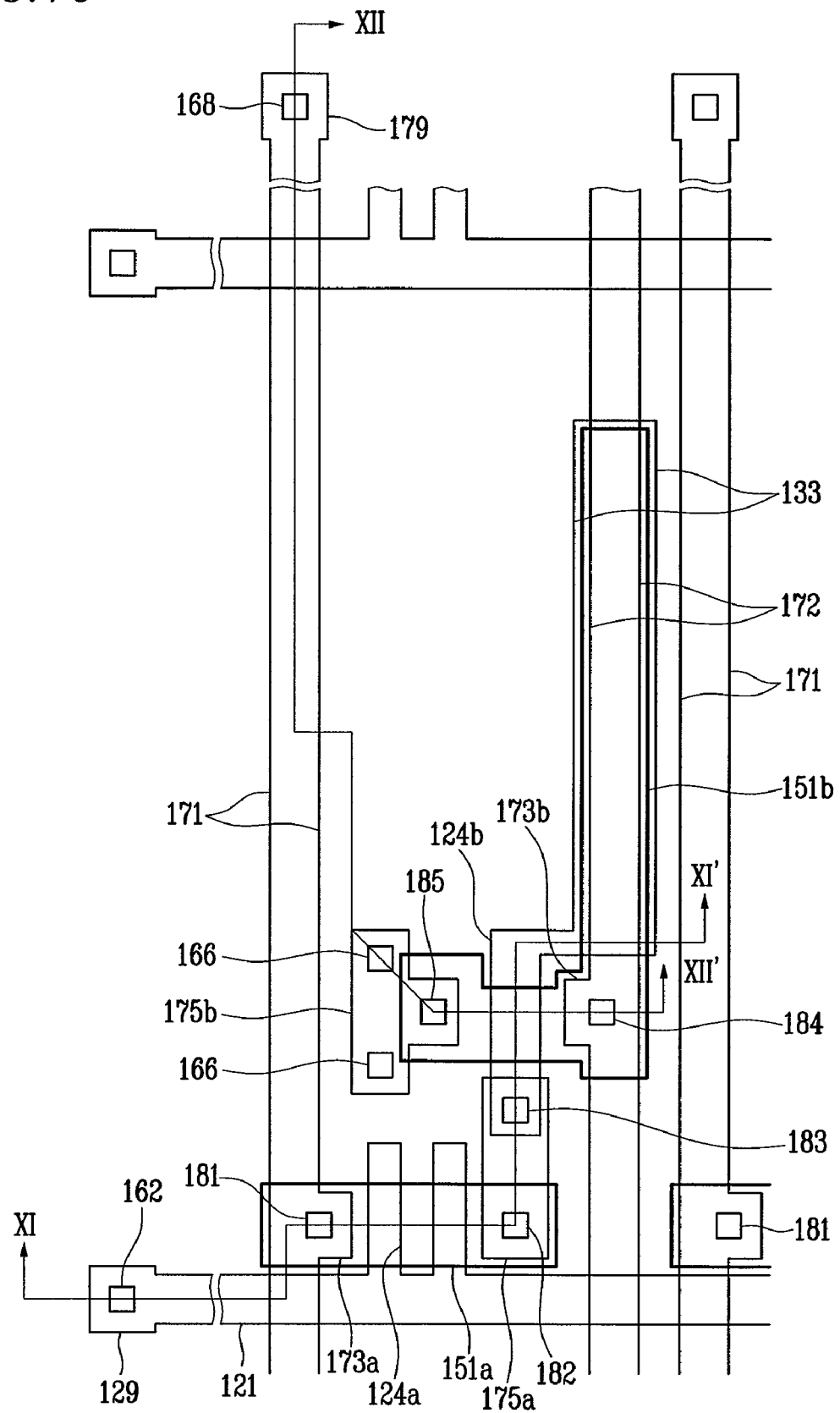
FIG. 10 is a layout of the thin film transistor array panel in a process after that of FIG. 7.
Figure 11:
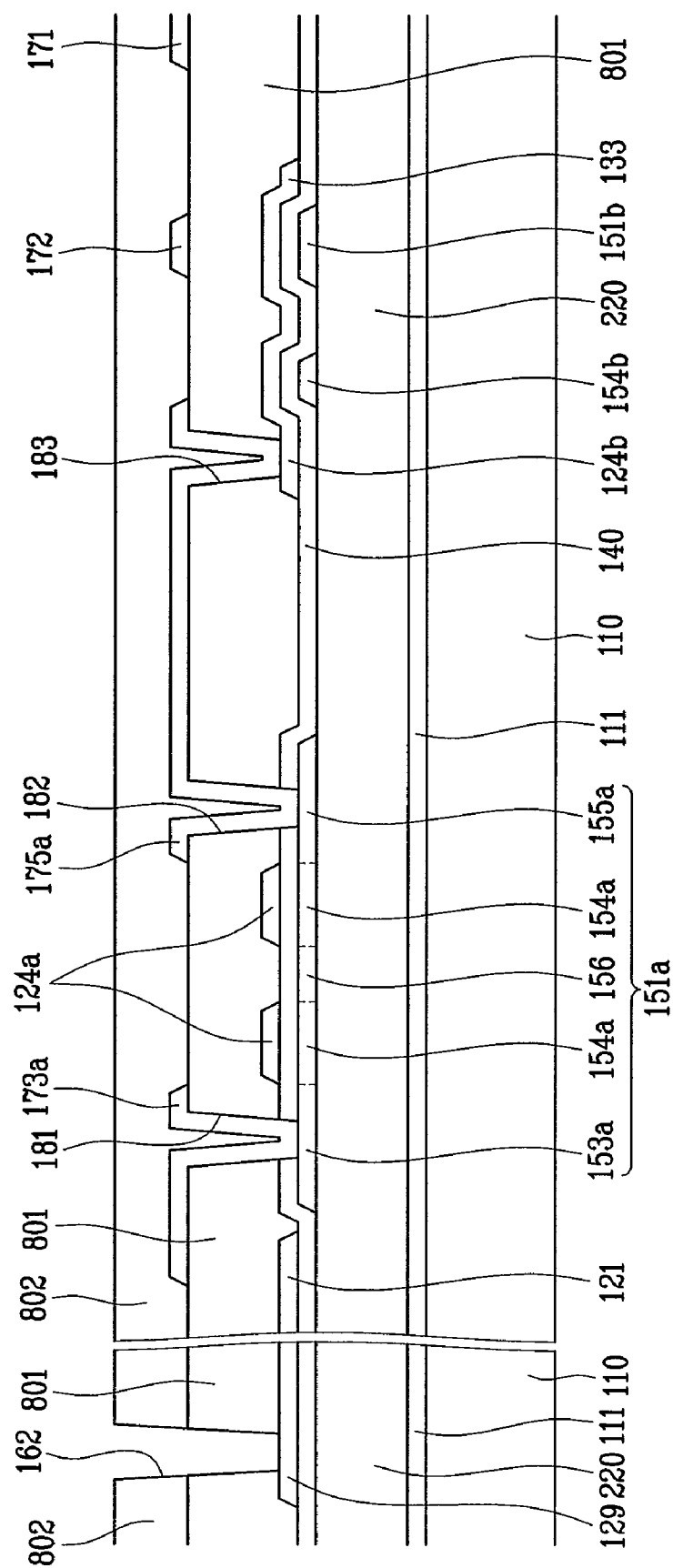
FIG. 11 and FIG. 12 are cross-sectional views of the thin film transistor array panel of FIG. 10 taken along lines XI-XI' and XII-XII', respectively.
Figure 12:
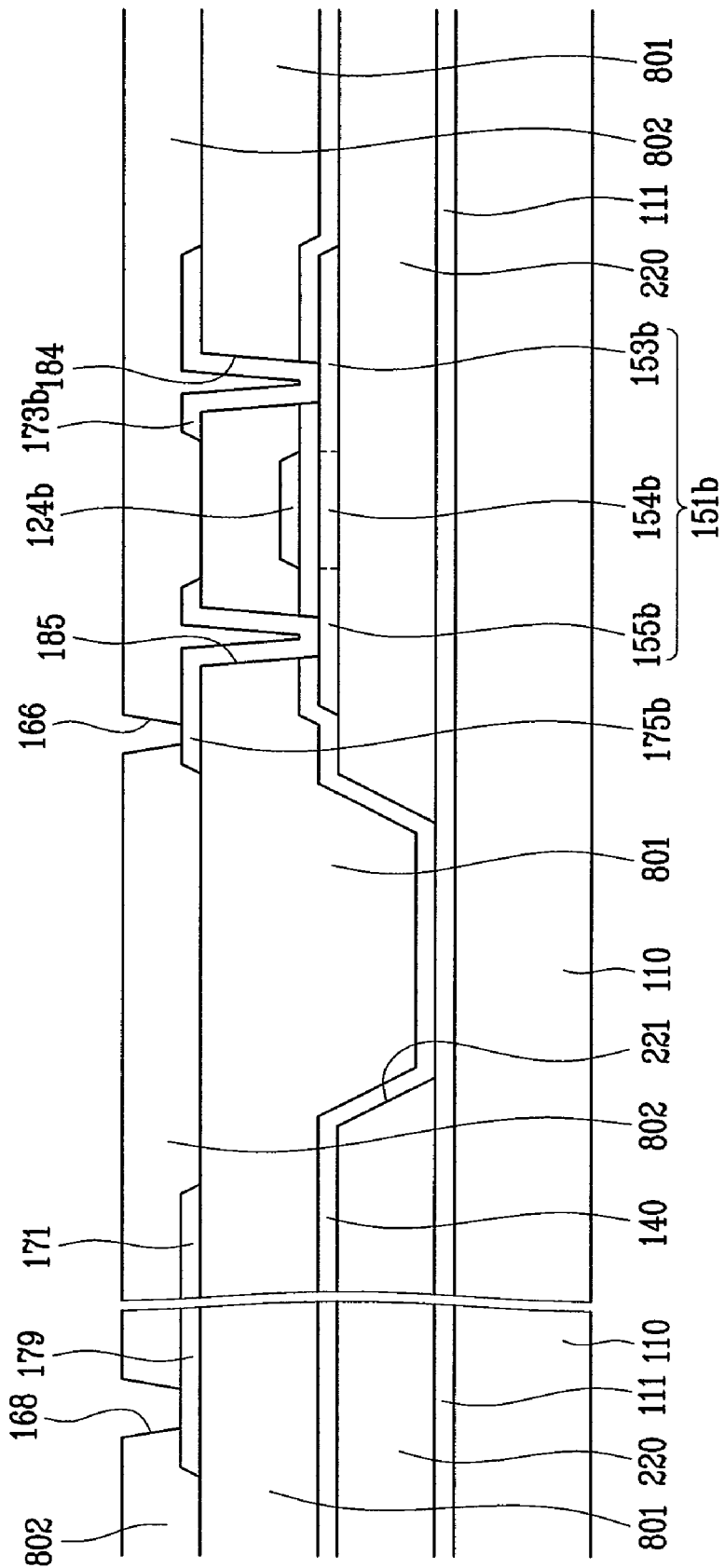
Figure 13:
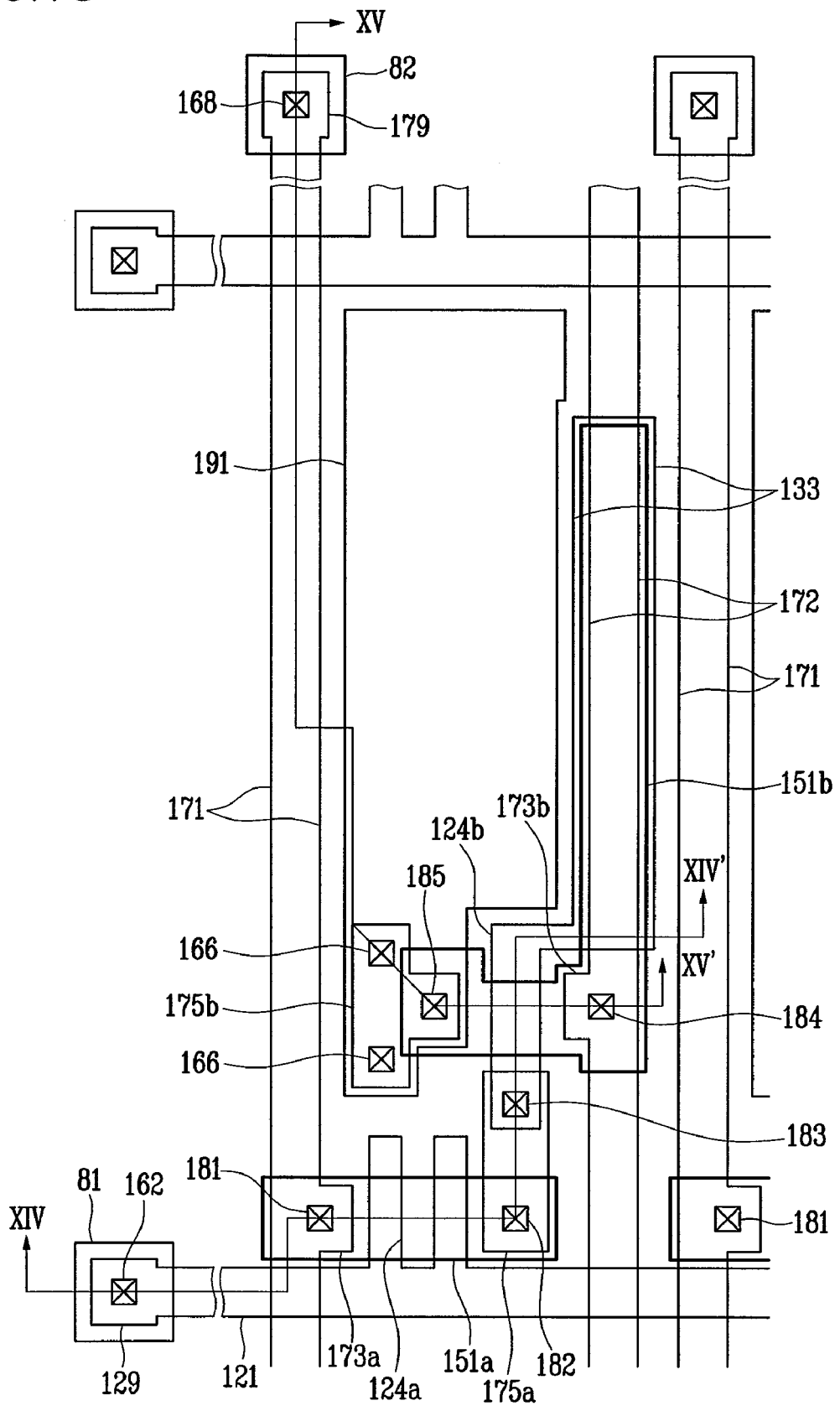
FIG. 13 is a layout of the thin film transistor array panel in a process after that of FIG. 10.
Figure 14:
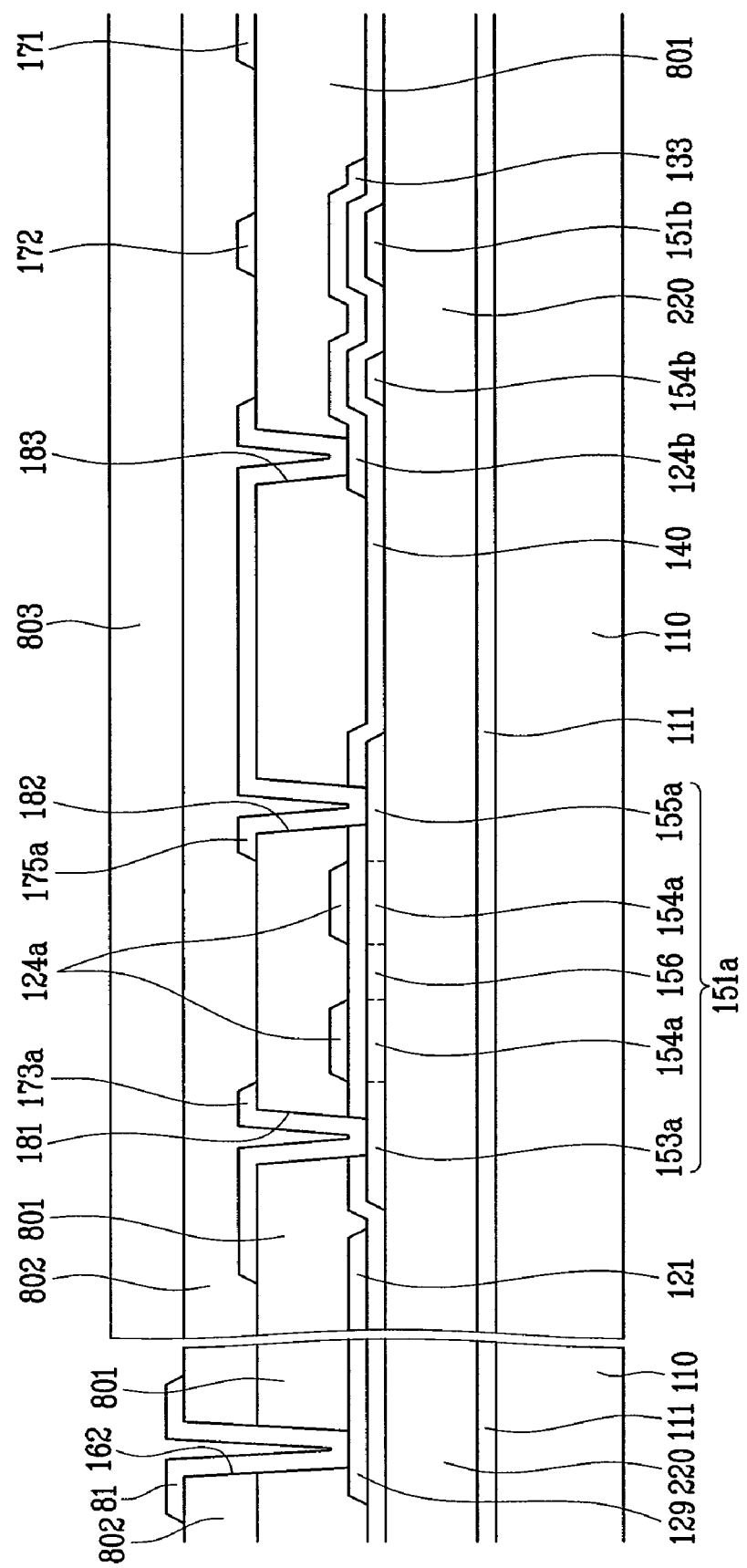
FIG. 14 and FIG. 15 are cross-sectional views of the thin film transistor array panel of FIG. 13 taken along lines XIV-XIV and XV-XV', respectively.
Figure 15:
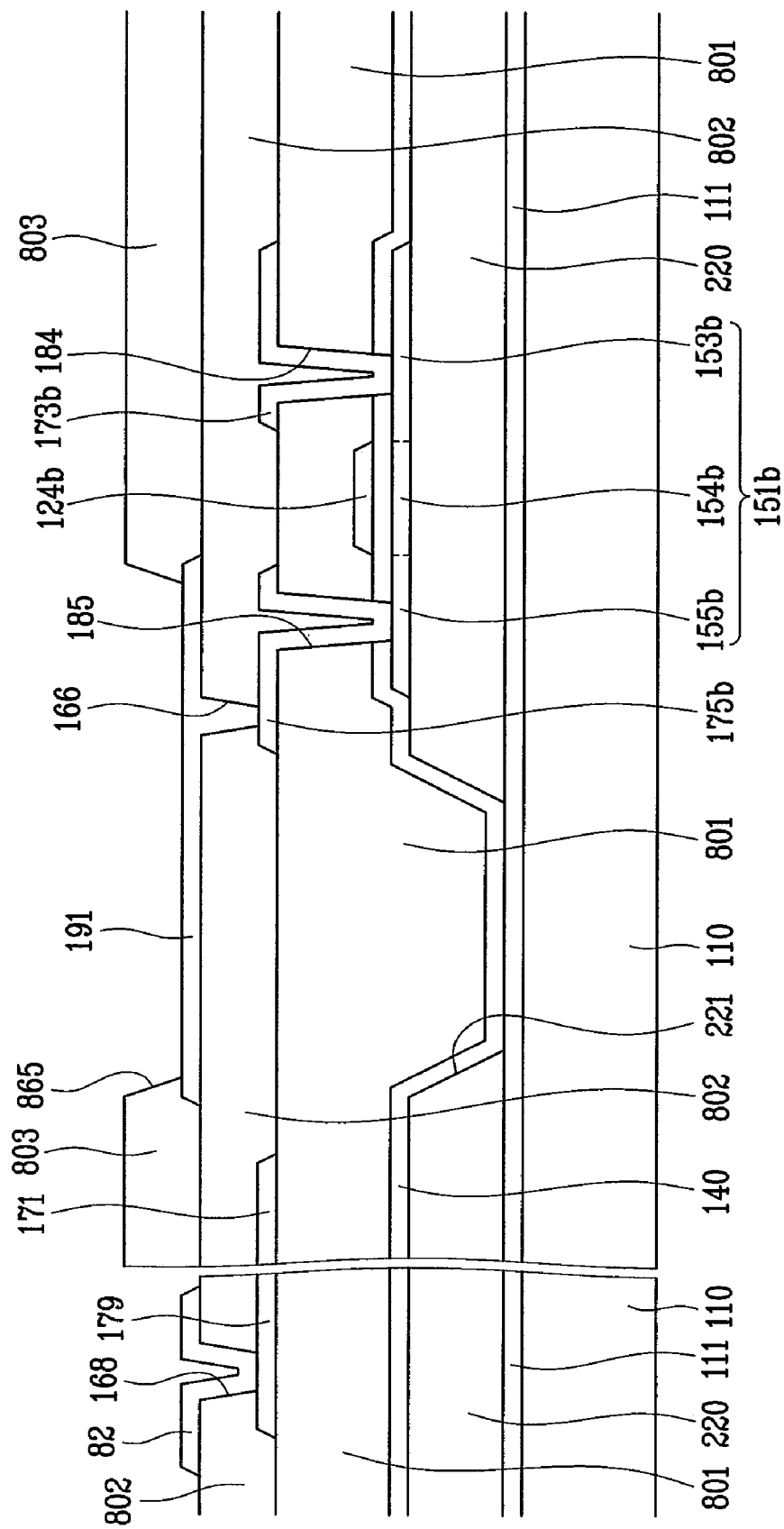

FIG. 4 is a panel layout during the manufacture of the thin film transistor array panel of FIG. 1 according to an exemplary embodiment of the present invention, and FIG. 5 and FIG. 6 are cross-sectional views of the thin film transistor array panel of FIG. 4 taken along lines V-V' and VI-VI', respectively. FIG. 7 is a layout of the thin film transistor array panel in a process following that of FIG. 4, FIG. 8 and FIG. 9 are cross-sectional views of the thin film transistor array panel of FIG. 7 taken along lines VIII-VIII' and IX-IX', respectively, FIG. 10 is a layout of the thin film transistor array panel in the next process of FIG. 7, and FIG. 11 and FIG. 12 are cross-sectional views of the thin film transistor array panel of FIG. 10 taken along lines XI-XI' and XII-XII', respectively. FIG. 13 is a layout of the thin film transistor array panel in a process following that of FIG. 10, and FIG. 14 and FIG. 15 are cross-sectional views of the thin film transistor array panel of FIG. 13 taken along lines XIV-XIV and XV-XV', respectively.

First, as shown in FIG. 4 to FIG. 6, a blocking film 111 is formed by depositing silicon oxide on an insulation substrate 110.

A light blocking member 220 is formed on the blocking film 111 by co-sputtering nickel and silicon oxide. Concentrations of nickel and silicon oxide may be varied as a function of distance from the substrate 110. The light blocking member 220 is completed by forming transmissive portions 221 in the pixel area by patterning the light blocking member. When nickel is used for the light blocking member 220, the nickel concentration is varied so that it is higher closer to the substrate 110. When silicon oxide is used for the light blocking member 220, its concentration is varied so that it is lower closer to the substrate 110. The light blocking member 220 blocks outside light from entering the device.

An amorphous semiconductor layer is then deposited on the light blocking member 220. First and second semiconductor islands 151a and 151b are formed by polycrystallizing and patterning the semiconductor layer using laser heat treatment (laser annealing), furnace heat treatment (furnace annealing), or sequential lateral solidification (SLS).

The infinitesimal amount of nickel included in the light blocking member 220 is diffused by heat applied during the laser heat treatment (laser annealing), furnace heat treatment (furnace annealing), or sequential lateral solidification (SLS). The diffused nickel induces solidification of the first and second semiconductor islands 151a and 151b, called metal induced crystallization (MIC). The nickel of the light blocking member 220 is a polycrystallizing seed for polycrystallizing an amorphous semiconductor.

Accordingly, with the method of the present invention, the polycrystallization speed of the amorphous semiconductor for forming the first and second semiconductor islands 151a and 151b is faster and more crystals can be formed at a lower temperature compared to with the conventional method. Further, the cost for manufacturing an organic light emitting device is reduced.

After forming the first and the second semiconductor islands 151a and 151b, as shown in FIG. 7 to FIG. 9, a gate insulating layer 140 is formed on the light blocking member 220 and the semiconductor islands 151a and 151b. Gate lines 121 having first control electrodes 124a and second control electrodes 124b, and storage electrodes 133 are formed on the gate insulating layer 140. The second control electrodes 124b are electrically connected with the storage electrodes 133.

By using the gate lines 121, the second control electrodes 124b, and the storage electrodes 133 as a mask, impurities are injected into the first and second semiconductor islands 151a and 151b. Accordingly, regions of the semiconductor islands 151a and 151b under the first control electrodes 124a and the second control electrodes 124b are a first channel region 154a and a second channel region 154b, respectively. The first source region 153a and the first drain region 155a of the first semiconductor island 151a are separated by the first channel regions 154a, and an intermediate region 156 is formed between the first channel regions 154a. Similarly, the second source region 153b and the second drain region 155b of the second semiconductor island 151b are separated by the second channel region 154b.

A first interlayer insulating layer 801 having contact holes 181, 182, 183, 184, and 185 is then formed on the gate insulating layer 140 and the gate conductors 121 and 124b. The first interlayer insulating layer 801 may be made of silicon oxide (SiOx) or silicon nitride (SiNx).

The contact holes 181, 182, 183, 184, and 185 of the first interlayer insulating layer 801 expose portions where the first and second source regions 153a and 153b, the first and second drain regions 155a and 155b, and the second control electrodes 124b are positioned.

As shown in FIG. 10 to FIG. 12, data lines 171, first output electrodes 175a, driving voltage lines 172, and second output electrodes 175b are formed on the first interlayer insulating layer 801.

The data lines 171 include first input electrodes 173a electrically connected with the first source region 153a through the contact holes 181, and the driving voltage lines 172 include second input electrodes 173b electrically connected with the second source region 153b through the contact holes 184. The first output electrodes 175a are electrically connected with the first drain region 155a and the second control electrodes 124b through the contact holes 182 and 183, and the second output electrodes 175b are electrically connected with the second drain region 155b through the contact holes 185.

Subsequently, a second interlayer insulating layer 802 having contact holes 162, 166, and 168 is formed on the data conductors 171, 172, 175a, and 175b and the first interlayer insulating layer 801. The contact hole 162 exposes the end 129 of the gate line 121, the contact hole 166 exposes the second output electrode 175b, and the contact hole 168 exposes the wide end 179 of the data line 171.

As shown in FIG. 13 to FIG. 15, pixel electrodes 191 and contact assistants 81 and 82 are formed on the second interlayer insulating layer 802.

The pixel electrodes 191 are electrically connected with the second output electrodes 175b exposed through the contact holes 166, and the contact assistants 81 and 82 are respectively electrically connected with the ends 129 of the gate lines 121 and the ends 179 of the data lines 171.

The third interlayer insulating layer 803 having the opening 865 that extends to the pixel electrode 191 is then formed on the second interlayer insulating layer 802. An organic light emitting member 370 is formed inside the openings 865 of the third interlayer insulating layer 803.

The third interlayer insulating layer 803 may be formed of a photoresist, and prevents outside light from leaking into the device together with the light blocking member 220. Accordingly, the contrast ratio and quality of the image are improved by blocking the outside light that would be reflected by the gate conductors 121, 124a, 124b, the data conductors 171, 172, 175a, 175b, and the pixel electrodes 191, and preventing any inside light from leaking out. The common electrode 270 is subsequently formed on the third interlayer insulating layer 803 and the organic light emitting member 370.

As described above, according to a method of the present invention, the light blocking member 220 made of nickel and silicon oxide is disposed below the first and second semiconductor islands 151a and 151b. When the first and second semiconductor islands 151a and 151b crystallize according to a method of the present invention, nickel is used as a seed for the crystallization of the first and second semiconductor islands 151a and 151b, so that the first and second semiconductor islands 151a and 151b crystallize faster. Therefore, total manufacturing time for the organic light emitting device is reduced.

Further, the light blocking member 220 is disposed at regions other than the regions corresponding to the pixel electrodes 191, such that any outside light that is reflected by metal wiring, such as the pixel electrodes 191 and data conductors 171, 172, 175a, 175b, and any leakage of inside light are prevented. Accordingly, luminance of the organic light emitting device is improved and the quality of the image is correspondingly improved.

According to the method of the present invention, the crystallization speed of the semiconductor islands is improved by disposing a light blocking member formed of nickel and silicon oxide below a plurality of semiconductor islands. The manufacturing time is reduced by the faster crystallization speed.

Further, the light blocking member is disposed at regions corresponding to the pixel electrodes, so that any outside light reflected by metal wiring such as the pixel electrodes, gate conductors, and data conductors, and any leakage of inside light, are prevented. Therefore, the contrast ratio and quality of the image of the organic light emitting device are improved.

While this invention has been described in connection with what is presently considered to be practical exemplary embodiments, it is to be understood that the invention is not limited to the disclosed embodiments and is intended to cover various modifications and equivalent arrangements included within the spirit and scope of the appended claims.

What is claimed is:

1. A display device comprising:
   a substrate;
   a light blocking member disposed on the substrate, wherein the light blocking member contains nickel and silicon oxide;
   a semiconductor layer disposed on the light blocking member and comprising a channel region;
   a gate insulating layer disposed on the semiconductor layer;
   gate conductors disposed on the gate insulating layer;
   a first interlayer insulating layer disposed on the gate insulating layer and the gate conductors;
   data conductors disposed on the first interlayer insulating layer;
   a second interlayer insulating layer disposed on the data conductors and the first interlayer insulating layer;
   a pixel electrode disposed on the second interlayer insulating layer;
   a third interlayer insulating layer having an opening extending to the pixel electrode;
   an organic light emitting member formed inside the opening; and
   a common electrode disposed on the organic light emitting member and the third interlayer insulating layer;
   wherein the channel region of the semiconductor layer overlaps with the light blocking member.

2. The display device of claim 1, wherein proportions of nickel and silicon oxide vary with distance from the substrate.

3. The display device of claim 1, wherein the nickel concentration in the light blocking member increases closer to the substrate.

4. The display device of claim 1, wherein the silicon oxide concentration in the light blocking member decreases closer to the substrate.

5. The display device of claim 1, wherein the light blocking member includes a transmissive portion that is covered by the pixel electrode.

6. The display device of claim 1, wherein the semiconductor layer is a polysilicon.

7. A method of manufacturing a display device, the method comprising:
   forming a light blocking member on a substrate by co-sputtering nickel and silicon oxide;
   forming a semiconductor layer on the light blocking member and comprising a channel region;
   forming a gate insulating layer on the semiconductor layer and the light blocking member;
   forming gate conductors on the gate insulating layer;
   forming a first insulating layer on the gate conductors and the gate insulating layer;
   forming data conductors on the first insulating layer;
   forming a second insulating layer on the data conductors and the first insulating layer;
   forming a pixel electrode on the second insulating layer;
   forming a third insulating layer having an opening that extends to the pixel electrode;
   forming an organic light emitting member in the opening; and
   forming the organic light emitting member and the third insulating layer,
   wherein the channel region of the semiconductor layer overlaps with the light blocking member.

8. The method of claim 7, wherein forming the light blocking member comprises forming a transmissive portion that is covered by the pixel electrode.

9. The method of claim 7, wherein the semiconductor layer comprises polysilicon.

10. A display device comprising:
    a substrate;
    a light blocking member disposed on the substrate, the light blocking member containing nickel and silicon oxide;
    a semiconductor layer disposed on the light blocking member and comprising a channel region;
    a gate insulating layer disposed on the semiconductor layer;
    control electrodes disposed on the gate insulating layer;
    a first interlayer insulating layer disposed on the control electrodes and the gate insulating layer, and having contact holes;
    input electrodes and output electrodes disposed on the first interlayer insulating layer, electrically connected with the semiconductor layer through the contact holes, and separated from each other by the control electrodes;
    a second interlayer insulating layer disposed on the input electrodes, the output electrodes, and the first interlayer insulating layer; and
    pixel electrodes disposed on the second interlayer insulating layer,
    wherein the channel region of the semiconductor layer overlaps with the light blocking member.

11. The display device of claim 10, wherein proportions of nickel and silicon oxide vary with distance from the substrate.

12. The display device of claim 10, wherein the nickel concentration increases closer to the substrate.

13. The display device of claim 10, wherein the silicon oxide concentration in the light blocking member decreases closer to the substrate.

14. The display device of claim 10, wherein the light blocking member has a transmissive portion that is disposed such that it is covered by the pixel electrode.

* * * * *